(12) United States Patent
Zeidan et al.

(10) Patent No.: US 6,478,170 B1
(45) Date of Patent: Nov. 12, 2002

(54) EMC SEALED JOINT AND A FACEPLATE FOR USE THEREWITH

(75) Inventors: Dany M. Zeidan, Howell, NJ (US); Nicholas J. Matera, Howell, NJ (US)

(73) Assignee: TerraWorx, Inc., Shrewsbury, NJ (US)

( * ) Notice: Subject to any disclaimer, the term of this patent is extended or adjusted under 35 U.S.C. 154(b) by 0 days.

(21) Appl. No.: 09/877,670

(22) Filed: Jun. 8, 2001

(51) Int. Cl.$^7$ ............................. A47F 5/00; H05K 9/00
(52) U.S. Cl. ................ 211/183; 211/26; 211/41.17; 174/35 GC; 361/816; 361/818
(58) Field of Search ............... 211/183, 26, 41.17; 361/816, 818, 704; 174/35 GC

(56) References Cited

U.S. PATENT DOCUMENTS

| | | | |
|---|---|---|---|
| 4,631,641 A | 12/1986 | Brombal et al. ............ 361/424 |
| 5,083,239 A | 1/1992 | Sedlemeier et al. ......... 361/424 |
| 5,233,507 A * | 8/1993 | Gunther et al. ............. 361/818 |
| 5,467,254 A | 11/1995 | Brusati et al. .............. 361/799 |
| 5,504,657 A * | 4/1996 | Stocco .................... 361/816 X |
| 5,770,822 A * | 6/1998 | Abditz et al. .......... 174/35 GC |
| 5,796,594 A * | 8/1998 | Kabat et al. ............... 361/818 |
| 5,832,073 A | 11/1998 | Hannigan et al. ............ 379/325 |
| 5,934,915 A | 8/1999 | Henningsson et al. ......... 439/92 |
| 5,943,219 A | 8/1999 | Bellino et al. ............... 361/816 |
| 6,043,991 A | 3/2000 | Sorrentino ................. 361/816 |
| 6,078,504 A | 6/2000 | Miles ........................ 361/727 |
| 6,080,930 A | 6/2000 | Lommen et al. ........ 174/35 GC |
| 6,204,444 B1 | 3/2001 | Pugliese et al. ....... 174/35 GC |
| 6,395,976 B1 * | 5/2002 | Koradia et al. ......... 174/35 GC |
| 6,399,880 B1 * | 6/2002 | Bedrosian et al. ...... 174/35 GC |

* cited by examiner

*Primary Examiner*—Robert W. Gibson, Jr.

(57) ABSTRACT

An EMC sealed joint is used within electronic equipment to provide compliance with electromagnetic compatibility (EMC) standards. In one example, EMC sealed joints are used with faceplates mounted to printed wiring boards stacked side by side in an electronic equipment rack, for example, to seal the adjacent faceplates against one another and to seal the faceplates to the shelf edge portions in the rack. One type of EMC sealed joint is formed by a concave groove in a side portion of the faceplate, which receives an EMC gasket located on an adjacent faceplate. Another type of EMC sealed joint is formed by protrusions on a back surface of the front portion of the faceplate, which engage a flat surface on a shelf edge portion in the electronic equipment rack.

17 Claims, 7 Drawing Sheets

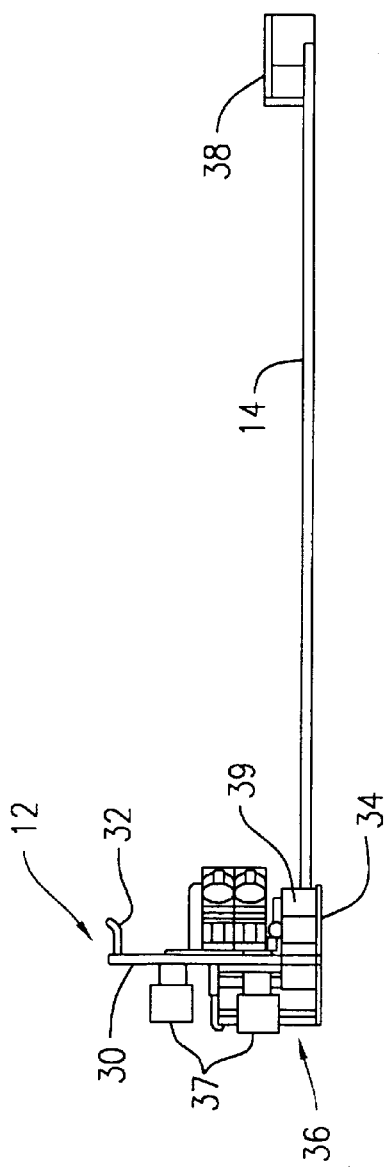
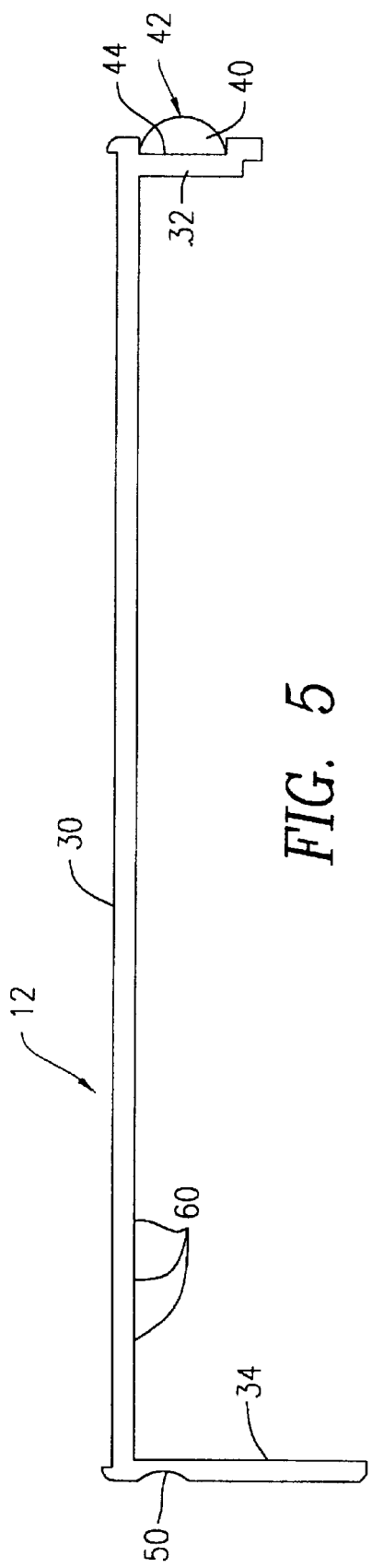

EMC SEALED JOINT AND A FACEPLATE FOR USE THEREWITH

TECHNICAL FIELD

The present invention relates to electromagnetic compatibility (EMC) seals for use in joints within electronic assemblies and more particularly, relates to faceplates having an EMC seal between them in a rack and/or an EMC seal between a faceplate and a shelf.

BACKGROUND INFORMATION

Electronic equipment emits signals, known as electromagnetic interference (EMI), which can interfere with the electronic equipment itself or with other devices. As more electronic equipment is used, the potential for interference between the electronic equipment increases. Electromagnetic compatibility (EMC) is a measure of how well electronic equipment shares the electromagnetic environment without adverse effects from EMI. The goal of EMC is to construct electronic equipment with sufficiently low electromagnetic emissions and electromagnetic susceptibility. Electronic equipment can also be damaged by electrostatic discharge (ESD). As a result, electronic equipment must comply with stringent industry standards for EMC and ESD.

EMC and ESD standards must be met for a rack of printed wiring boards stacked side by side, for example, as used in the telecommunications industry. Faceplates, mounted to the printed wiring boards, are located side by side on a shelf in the rack. To provide EMC compliance (for both emissions and susceptibility), gaps/slits between the faceplates and between the faceplate and the shelf (i.e., on the top and bottom) should be sealed. Previous attempts to seal the gaps/slits between the faceplates included the use of an EMC gasket placed on one side of each faceplate to seal against the flat surface of an adjacent faceplate. Previous attempts to seal the gaps/slits between the faceplates and the shelf included the use of a custom gasket generally placed on the top and bottom of the shelf's frontal edges to seal against the flat surface of the faceplate.

A problem that arises with those devices and methods is that a non-continuous seal often forms between the mating faceplates and/or between the faceplates and the shelf. This creates slot antennas, which become the cause of EMC leakage. This non-continuous seal can be caused by a creased gasket, an oxidized gasket and/or oxidized base metal contacting the gasket, or an inadequate mating force. Oxidation of the gasket material and/or the base metal contacting the gasket material can also render the surface non-conductive, thereby reducing the effectiveness of the electrical contact and consequently the EMC seal. Moreover, the gasket may not have been placed on the shelf and/or faceplate following vendor specifications of surface treatment, adhesive curing time and temperature, handling, and the like, thus rendering the gasket deficient.

Efforts have been made to improve the EMC sealing between the faceplates, and between the faceplates and shelf. For instance, improvements are shown by increasing the mating force/pressure providing special surface treatment of the gasket and/or mating surface, and special handling or packaging of the gasket, faceplate, and shelf to avoid creasing, tearing and oxidation. Those solutions have either been unsuccessful or have significantly increased the cost of the devices.

Accordingly, there is a need for an EMC sealed joint that provides an effective EMC seal while minimizing or eliminating the necessity to increase the mating force/pressure, the necessity to provide special surface treatment of the gasket and/or mating surface, and/or the necessity to provide special handling or packaging of the gasket, faceplate or shelf to avoid creasing, tearing, or oxidation. In particular, there is a need for a faceplate that insures electrical contact with an effective EMC seal between the top and bottom edges of a shelf and/or between adjacent faceplates in compliance with industry standards for EMC and ESD.

SUMMARY

In accordance with one aspect of the present invention, a faceplate is provided for electrically contacting and sealing against an adjacent faceplate in an electronic equipment rack. The faceplate comprises a front portion, a first side portion extending from one side of the front portion for receiving an EMC gasket, and a second side portion extending from an opposite side of the front portion. The second side portion has a concave groove forming edges at each side of the concave groove. The concave groove mates with an EMC gasket on the adjacent faceplate. The concave groove is preferably formed between flat surfaces on the second side portion such that the edges are formed where the concave groove meets the flat surfaces.

In accordance with another aspect of the present invention, a faceplate is provided for electrically contacting and sealing against a shelf in an electronic equipment rack. The faceplate comprises a front portion having a series of protrusions located on a back surface of the front portion at least in the regions of the back surface that contact respective edges of the shelf. At least one side portion extends from one side of the front portion, for mounting to a printed wiring board.

According to a preferred embodiment of the faceplate for sealing against the shelf, the protrusions include ribs. The ribs preferably extend the length of the front portion and are spaced at predetermined intervals, for example, to maximize the EMC seal by minimizing the size of the slot antenna intervals. Alternatively, the protrusions include dimples located at least near the ends of the front portion and spaced at intervals. The protrusions preferably have a convex outer surface.

In accordance with another aspect of the present invention, a faceplate is provided for electrically contacting and sealing against both an adjacent faceplate and a shelf in an electronic equipment rack. The faceplate includes the protrusions for contacting the shelf edges and the concave groove for receiving an EMC gasket on an adjacent faceplate.

In accordance with another aspect of the present invention, an EMC sealed joint comprises a first electromagnetically conductive member, an EMC gasket attached to the first electromagnetically conductive member, and a second electromagnetically conductive member including a concave groove with edges. The concave groove mates with the EMC gasket such that a portion of the outer convex surface of the EMC gasket sits in the concave groove. The edges of the concave groove make contact with the EMC gasket such that the interface of the EMC gasket and the second electromagnetically conductive member is overlapping in the concave/convex interface and the interference with the two edges of the groove. In a preferred embodiment, the electromagnetically conductive member may be metal or a composite, including an electromagnetically conductive layer.

In accordance with another aspect of the present invention, an EMC sealed joint comprises a first electromagnetically conductive member having a flat surface, and a second electromagnetically conductive member including a plurality of convex protrusions, such as ribs, in contact with the flat surface of the first electromagnetically conductive member. The convex protrusions are spaced at predetermined intervals on the second electromagnetically conductive member to maximize efficiency of the EMC seal. In a preferred embodiment, the electromagnetically conductive member may be metal, or a composite, including an electromagnetically conductive layer.

In accordance with a further aspect of the present invention, a mating faceplate assembly comprises at least first and second faceplates and an EMC gasket attached to the first side portion of the first faceplate such that the EMC gasket mates with the concave groove of the second faceplate.

In accordance with yet another aspect of the present invention, a rack assembly comprises first and second shelf edge portions, and at least first and second faceplates positioned against the shelf edge portions. Each of the faceplates comprises a front portion having a series of protrusions located on a back surface thereof. The protrusions are located at least in the regions of the back surface that contact the shelf edge portions. At least first and second printed wiring boards are mounted to the respective faceplates.

BRIEF DESCRIPTION OF THE DRAWINGS

These and other features and advantages of the present invention will be better understood by reading the following detailed description, taken together with the drawings wherein:

FIG. 4 is a top view of the faceplate mounted to the printed wiring board shown in FIGS. 2 and 3;

FIG. 5 is a top view of the faceplate with an EMC gasket, according to one embodiment of the present invention;

DETAILED DESCRIPTION OF THE PREFERRED EMBODIMENTS

Figure 1:
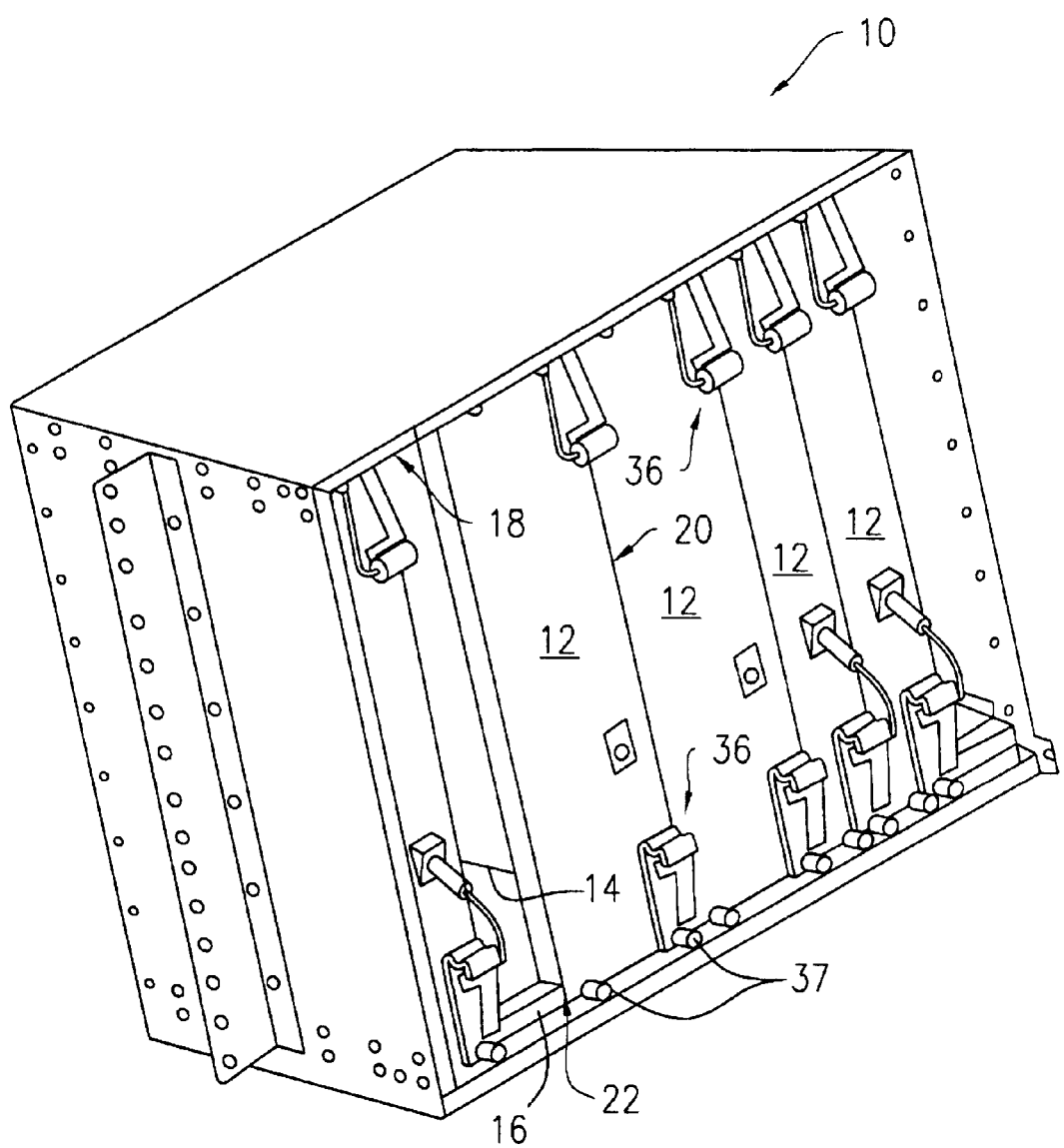
FIG. 1 is a front perspective view of an electronic equipment rack including faceplates, according to one embodiment of present invention.

Referring to FIG. 1, an electronic equipment rack 10 includes a plurality of faceplates 12 mounted to printed wiring boards (PWBs) 14. The faceplates 12 with the PWBs 14 are stacked side by side in the rack 10. EMC sealing is provided in the joints 20 between the adjacent faceplates 12 and the joints 22 between the faceplates 12 and shelf edge portions 16, 18, as described in greater detail below. Although the exemplary embodiment shows a rack 10 with a certain type of faceplate 12, the EMC sealing according to the present invention can be used with other types of faceplates or in any joint or situation requiring an EMC seal, such as a door or lid mating with walls and side panels on a telecommunication box.

Figure 2:
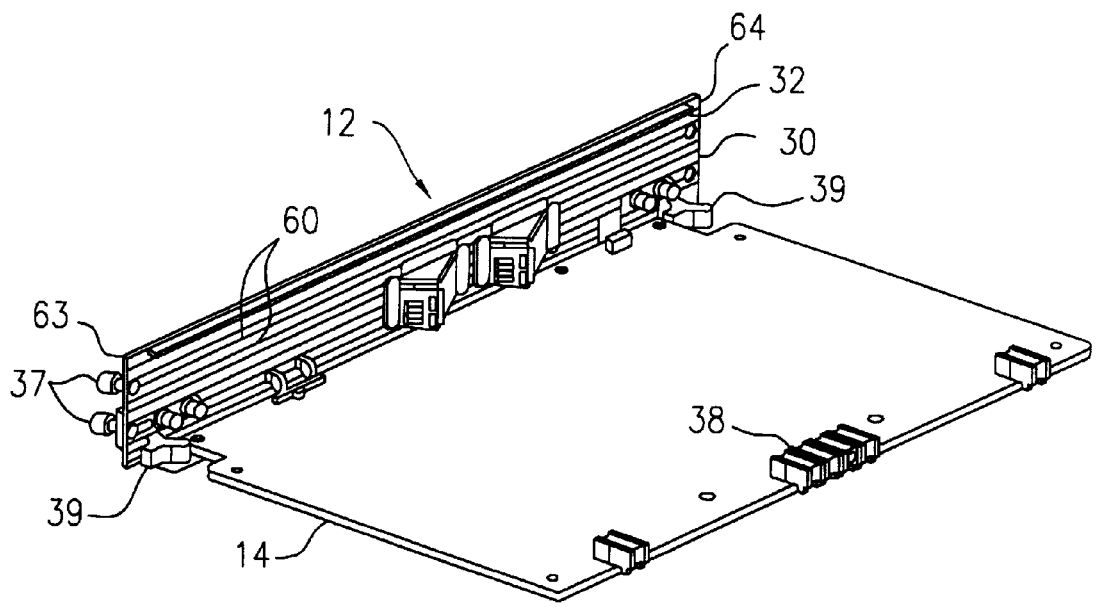
FIGS. 2 and 3 are side perspective views of the faceplate mounted to a printed wiring board, according to one embodiment of the present invention.
Figure 3:
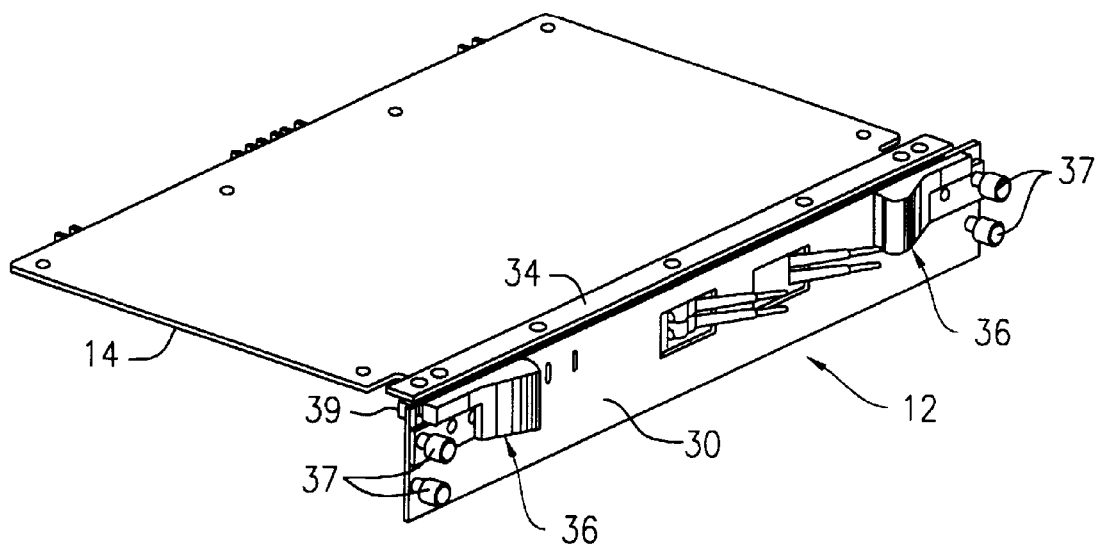

The exemplary embodiment of faceplate 12 and PWB 14 is shown in greater detail in FIGS. 2–4. The faceplate 12 preferably includes a front portion 30 and side portions 32, 34 extending from opposite sides of the front portion 30. Latches 36 are mounted to the faceplates 12 for latching the faceplates 12 and PWBs 14 to the shelf edges 16, 18 (see FIG. 1). The latches 36 include latch engaging members 39, which pivot into engagement with the shelf edges 16, 18. The exemplary faceplate 12 also includes fasteners 37 for securing the faceplates 12 to the shelf edges 16, 18. The exemplary PWB 14 is mounted to one side portion 34 of the faceplate 12 and includes connectors 38 for connecting the PWB 14 to a backplane (not shown) in the rack 10.

Figure 7:
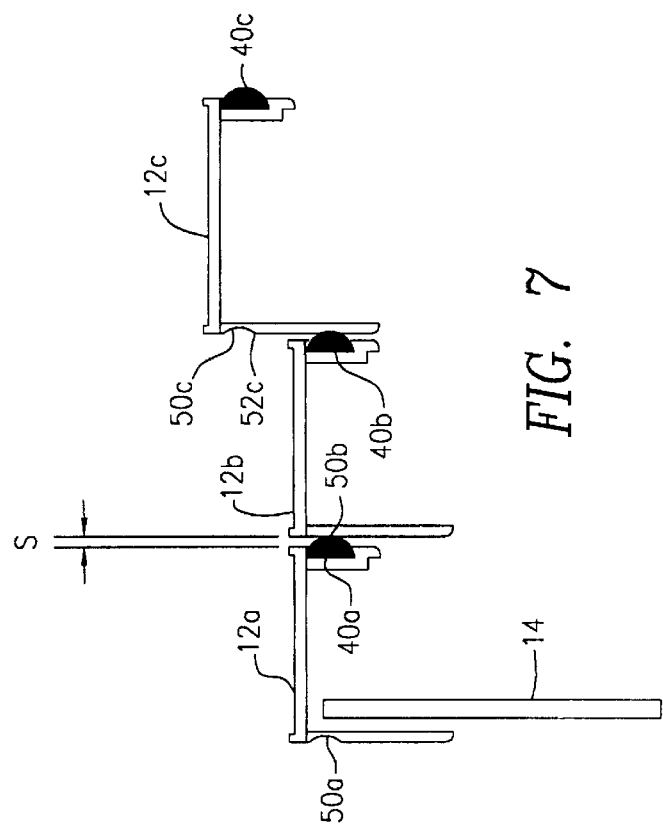
FIG. 7 is a top schematic view of an assembly of faceplates with EMC gaskets, according to one embodiment of the present invention.
Figure 6:
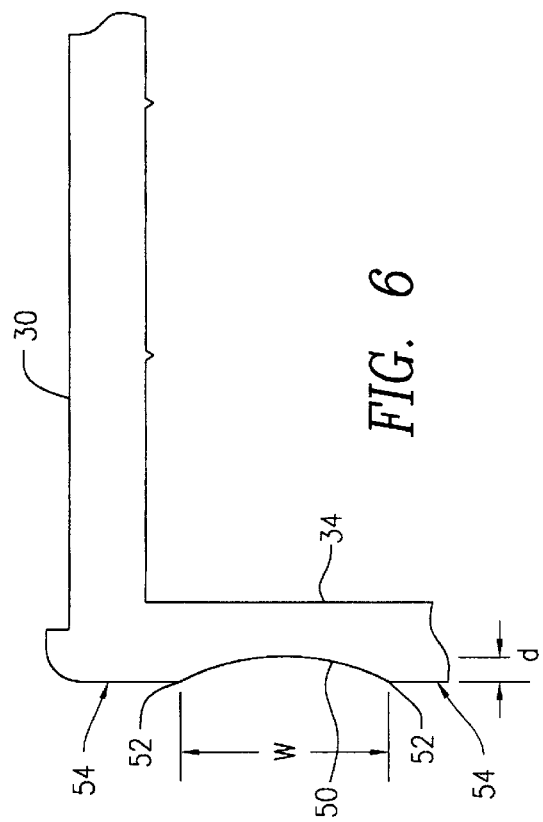
FIG. 6 is an enlarged view of a concave groove in the side portion of the faceplate shown in FIG. 5.
Figure 8:
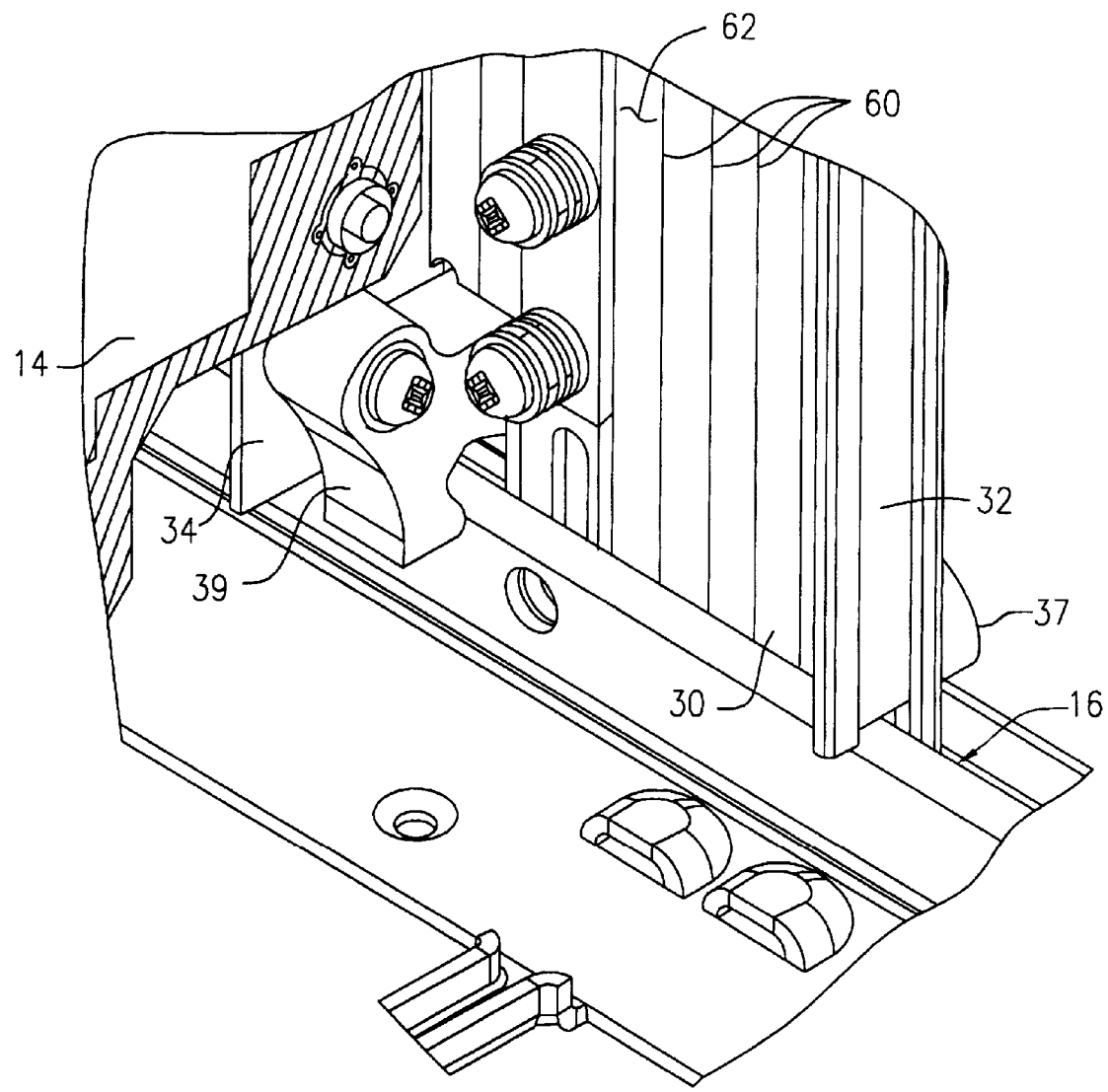
FIG. 8 is a perspective view of a section of a faceplate contacting a shelf edge portion in an electronic equipment rack, according to one embodiment of the present invention.
Figure 9:
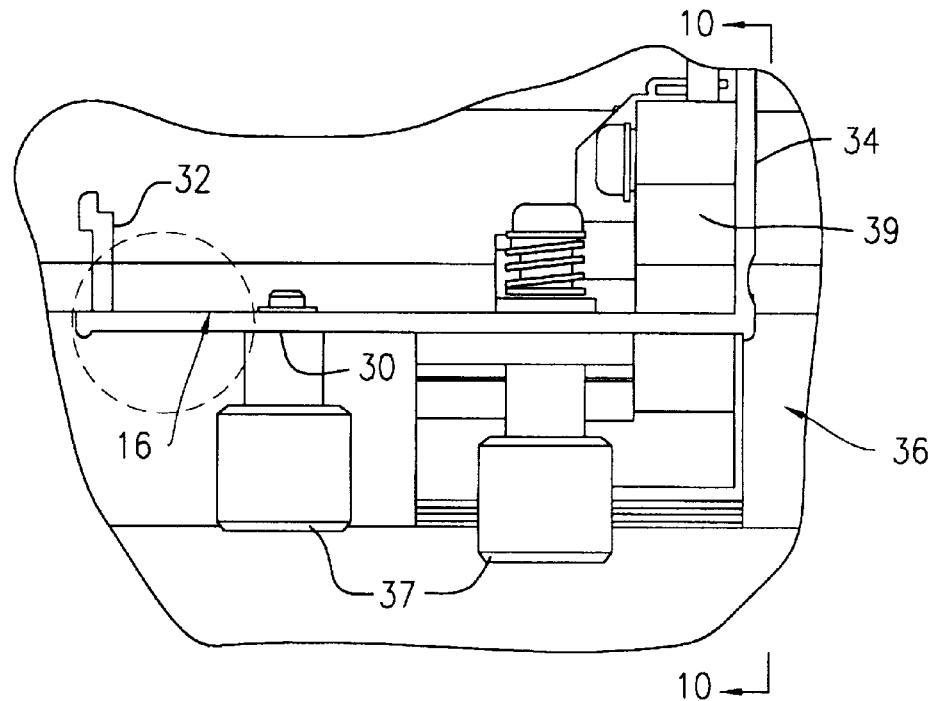
FIG. 9 is a top view of the faceplate contacting the shelf edge portion shown in FIG. 8.
Figure 10:
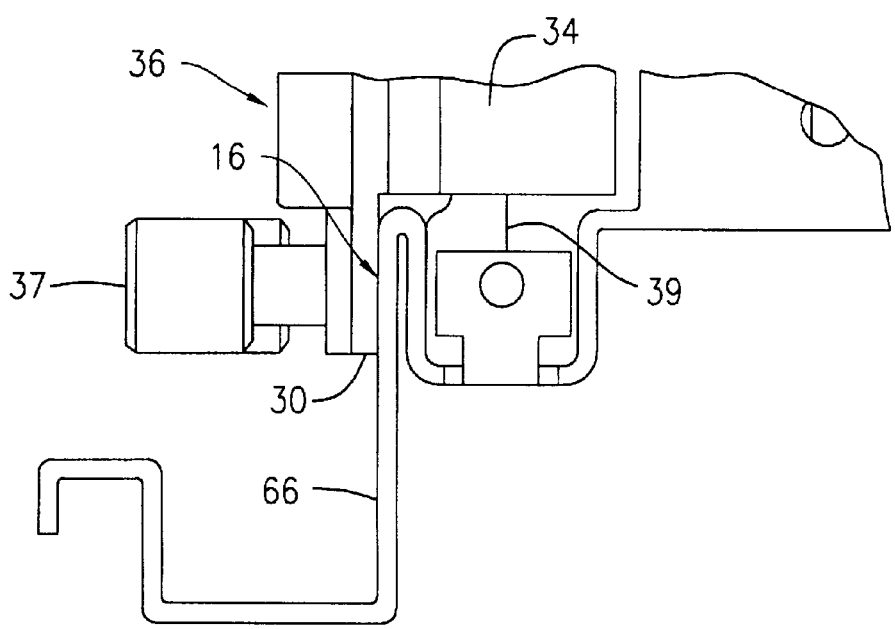
FIG. 10 is a side view of the faceplate contacting the shelf edge portion shown in FIG. 9 taken at section 10—10.
Figure 11:
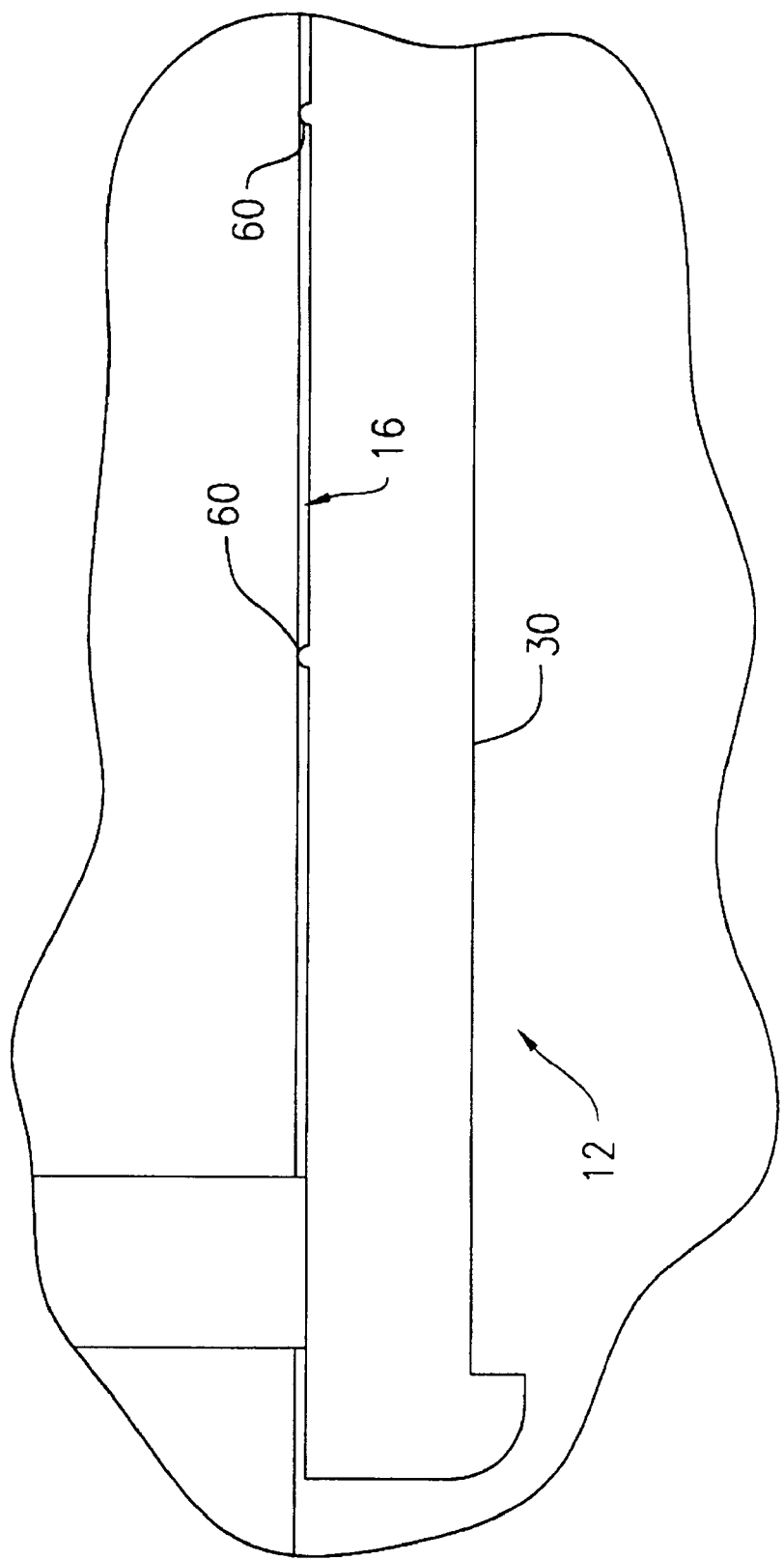
FIG. 11 is an enlarged view of protrusions on the faceplate contacting the flat surface of the shelf edge portion shown in FIG. 9.

Referring to FIGS. 5–7, the EMC sealed joint 20 between adjacent faceplates 12 is described in greater detail. An EMC gasket 40, as shown in FIG. 5, is attached to one side portion 32, for example, using an adhesive. The EMC gasket 40 preferably has a convex outer surface 42 and is made of a compressible material with a conductive outer surface material. One example of the EMC gasket 40 includes a foam material covered with an electromagnetically conductive weave mesh on the outside, such as an electrically conductive nickel plated woven nylon fabric jacket over urethane foam core available from Chomerics, Inc. Alternatively, the EMC gasket 40 can be made of any other type of an electromagnetically conductive material, such as a metal composite including an electromagnetically conductive layer, or conductive foam (i.e., without metal mesh) or beryllium copper (i.e. without foam). One embodiment of the faceplate 12 includes a channel 44 in the side portion 32 for holding the EMC gasket 40.

The other side portion 34 preferably includes a concave groove 50, as shown in greater detail in FIG. 6. The concave groove 50 is positioned on the side portion 34 such that the groove 50 receives the EMC gasket 40 of an adjacent faceplate. The concave groove 50 provides a graceful surface for receiving the EMC gasket 40 and provides a larger surface area of matability (i.e., larger than a flat surface). This increases the electrical seal contact surface and eliminates the potential for gaps (and slot antennas) caused by creased gaskets. The groove depth d is preferably sufficient to allow a controlled and uniform compression of the gasket 40 to meet the vendor's specifications for maximum shielding effectiveness. In one example, the concave groove 50 has a width w of about 4.1 mm and a depth d of about 0.46 mm with a radius of curvature of about 5.08 mm. The exemplary groove 50 with these dimensions provides a gasket compression of about 30%. Other groove dimensions are also contemplated to provide a different gasket compression.

The preferred embodiment of the concave groove 50 forms edges 52 at each side of the groove 50. Where the concave groove 50 is located between flat surfaces 54 on the side portion 34, for example, the edges 52 are formed where the concave groove 50 meets the flat surfaces 54. The edges 52 of the groove 50 in the faceplate 12 are preferably sharp enough to provide an abrasive edge that cuts through any oxide layer that may have built up on the gasket 40. Cutting through the oxide layer insures a low impedance electrical contact and consequently a good EMC seal. The edges 52 also provide redundant contact between the full length of both edges 52 and the EMC gasket 40.

An assembly of faceplates 12a–c having concave grooves 50a–c and EMC gaskets 40a–c is shown in FIG. 7. First and second faceplates 12a, 12b have been inserted (e.g., in the rack) and the EMC gasket 40a on the first faceplate 12a is engaged with the concave groove 50b on the second faceplate 12b. The EMC gasket 40a is compressed preferably leaving a spacing s between the first and second faceplates 12a, 12b of about 1 mm. The concave/convex interface of the groove 50b with the EMC gasket 40a provides an overlapping interface instead of the straight line interface between the gasket and flat surface on previous faceplate designs. The overlapping interface further minimizes any electromagnetic leaks between the faceplates 12a, 12b and provides a more efficient EMC seal. The concave/convex interface also prevents creasing or setting of the gasket 40a and insures a better seal even if the gasket 40a has already been creased, for example, due to the larger surface area overlap.

The third faceplate 12c is shown with an uncompressed gasket 40c as the faceplate 12c is being inserted. The front or leading edge 52c of the concave groove 50c scrapes the gasket 40b as the faceplate 12c is inserted. The scraped portion of the gasket 40b is then received within the groove 50c, providing improved electrical contact. The wiping action also scrapes the sharp edges on each side of the groove 50c of the faceplate 12c from any oxidation build-up on the edges.

Accordingly, the EMC sealed joint formed by the interface between the concave groove and the EMC gasket is capable of insuring a low impedance (e.g., <100 mΩ) electrical contact with a substantially 100% EMC seal. This EMC sealed joint also minimizes or eliminates the need to increase mating pressure, the need for special handling of the faceplate and/or gasket, and the need to provide special plating/finish on the gasket and/or faceplate. Furthermore, this EMC sealed joint can be implemented on a faceplate with minimal or no additional cost as part of the extrusion tool profile.

Referring to FIGS. 8–11, the EMC sealed joint 22 between the faceplate 12 and one shelf edge portion 16 is described in greater detail. Although not shown in detail, the EMC sealed joint between the faceplate 12 and the other shelf edge portion 18 is the same. The front portion 30 of the faceplate 12 includes protrusions 60 located on a back surface 62 of the front portion 30 at least in the regions of the faceplate 12 that contact the shelf edge portions 16, 18. The protrusions 60 preferably have a convex surface for making an interference contact with the flat surface of the shelf edge portion 16 (see FIG. 11). The protrusions 60 are also spaced at intervals sufficient to minimize the gaps between the contact points and essentially eliminate the slot antennas.

When the faceplate 12 is secured to the shelf edge portions 16, 18, the protrusions 60 preferably contact the shelf edge portions 16, 18 with a mechanical press fit sufficient to break through any oxide layer build-up, thereby providing an electrical contact for low impedance grounding and EMC sealing. The amount of interference between the protrusions 16 and the flat surface of the shelf edge 16 is preferably controlled such that the metal remains in the elastic state and retains its "memory" of shape. Thus, the mechanical interface between the two hard surfaces (i.e., the protrusion 60 and the flat surface of the shelf edge portion 16) does not introduce permanent creasing or deformation.

The interference between the protrusions 60 and the flat surface of the shelf edge portion 16 also allows the latch engaging member 39 to be slightly loaded against the shelf edge portion 16 (see FIGS. 8 and 10), providing an added grounding contact via the latch 36. This also assists in the extraction of the PWB 14, because the preload exerted by the interference between the protrusions 60 and the shelf edge portion 16 causes the latch 36 to swing open after unlocking the latch 36, thus assisting users in the extraction. In the exemplary embodiment, the shelf edge portion 16 is part of a guide plate 66 (see FIG. 10) used in the electronic equipment rack 10.

According to one preferred embodiment, the protrusions 60 (see FIG. 8) include ribs extending the full length of the front portion 30 of the faceplate 12 from one end 62 to the other end 63 of the faceplate 12 (see FIG. 2). The ribs also provide added stiffness and rigidity to the faceplate 12. In one example, the ribs are spaced at intervals of about 5 mm, have a height of about 0.10 mm, and have a width of about 0.18 mm. Although this exemplary embodiment is shown and described, the dimensions and intervals of the ribs may be different as determined by specific EMC requirements and the nature of the electronics within the equipment. Alternatively, the protrusions 60 can include shorter ribs (i.e., not extending the entire length of the faceplate) or dimples located only near the ends 63, 64 of the faceplate 12.

Accordingly, the EMC sealed joint formed by the interface between the protrusions and the flat surface is capable of insuring a low impedance (e.g., <100 mΩ) electrical contact with a substantially 100% EMC seal. The protrusions on the faceplate eliminate the need for custom EMC gaskets between the faceplates and shelf. This EMC seal joint also minimizes or eliminates the need to increase mating force/pressure, the need for special surface treatment of the gasket and/or mating surface, and the need for special handling or packaging of the gasket/faceplate/shelf to avoid creasing, tearing or oxidation. It also minimizes the requirement for flatness on the faceplate and/or rack edges, thus reducing the cost. Furthermore, this EMC sealed joint can be implemented on a faceplate with minimal or no additional cost as part of the extrusion tool profile.

Although the exemplary faceplate 12 includes both the groove 50 and the protrusions 60, a faceplate according to the present invention can include the groove 50 without the protrusions 60, or vice versa. The groove 50 and protrusions 60 can also be implemented on other types of metal members to provide EMC sealed joints in other situations, such as a door or lid mating with walls on a telecommunication box.

Modifications and substitutions by one of ordinary skill in the art are considered to be within the scope of the present invention, which is not to be limited except by the following claims.

The invention claimed is:

1. A faceplate for electrically contacting and sealing against an adjacent faceplate in an electronic equipment rack, said faceplate comprising:
    a front portion;
    a first side portion extending from one side of said front portion for receiving an EMC gasket; and
    a second side portion extending from an opposite side of said front portion, said second side portion having a concave groove forming edges at each side of said concave groove, and wherein said concave groove mates with an EMC gasket on the adjacent faceplate.

2. The faceplate of claim 1 wherein said concave groove is formed between flat surfaces on said second side portion, and wherein said edges are formed where said concave groove meets said flat surfaces.

3. A faceplate for electrically contacting and sealing against a shelf in an electronic equipment rack including printed wiring boards, said faceplate comprising:
   a front portion having a series of protrusions located on a back surface thereof at least in the regions of the back surface that contact respective edges of the shelf; and
   at least one side portion extending from one side of the front portion, for mounting to one of the printed wiring boards.

4. The faceplate of claim 3 wherein said protrusions include ribs.

5. The faceplate of claim 4 wherein said ribs extend the length of the back surface of said front portion.

6. The faceplate of claim 4 wherein said ribs are spaced at intervals.

7. The faceplate of claim 3 wherein said protrusions include dimples.

8. The faceplate of claim 7 wherein said dimples are spaced at intervals.

9. The faceplate of claim 3 wherein said protrusions have a convex outer surface.

10. A faceplate for electrically contacting and sealing against an adjacent faceplate and a shelf in an electronic equipment rack, said faceplate comprising:
    a front portion having a series of protrusions located on a back surface thereof at least in the regions of the back surface that contact respective edges of the shelf;
    a first side portion extending from one side of said front portion for receiving an EMC gasket; and
    a second side portion extending from an opposite side of said front portion, said second side portion having a concave groove forming edges at each side of said concave groove, and wherein said concave groove mates with an EMC gasket on the adjacent faceplate.

11. The faceplate of claim 10 wherein said protrusions include ribs.

12. The faceplate of claim 11 wherein said ribs extend a length of said front portion.

13. The faceplate of claim 11 wherein said ribs are spaced at intervals.

14. The faceplate of claim 10 wherein said protrusions include dimples.

15. The faceplate of claim 14 wherein said dimples are spaced at intervals.

16. The faceplate of claim 10 wherein said protrusions have a convex outer surface.

17. The faceplate of claim 10 wherein said concave groove is formed between flat surfaces on said second side portion, and wherein said edges are formed where said concave groove meets said flat surfaces.

* * * * *